US007184905B2

(12) United States Patent
Stefan

(10) Patent No.: US 7,184,905 B2
(45) Date of Patent: Feb. 27, 2007

(54) METHOD AND SYSTEM FOR MONITORING POWER SUPPLIES

(76) Inventor: Donald A. Stefan, 5530 Honea-Egypt Rd., Montgomery, TX (US) 77316

( * ) Notice: Subject to any disclaimer, the term of this patent is extended or adjusted under 35 U.S.C. 154(b) by 88 days.

(21) Appl. No.: 10/674,200

(22) Filed: Sep. 29, 2003

(65) Prior Publication Data

US 2005/0071093 A1 Mar. 31, 2005

(51) Int. Cl.
*G01R 31/36* (2006.01)
(52) U.S. Cl. ..................... 702/63; 320/116
(58) Field of Classification Search ............. 702/63; 320/116, 132, 134, 150
See application file for complete search history.

(56) References Cited

U.S. PATENT DOCUMENTS 6,031,354 A * 2/2000 Wiley et al. ............. 320/116

6,732,191 B1 * 5/2004 Baker et al. ............. 710/1

* cited by examiner

*Primary Examiner*—Michael Nghiem
*Assistant Examiner*—Stephen J. Cherry
(74) *Attorney, Agent, or Firm*—Russell J. Egan

(57) ABSTRACT

An electrical power (AC/DC) monitoring system remotely monitoring batteries and electrical power systems through a call center, providing continual monitoring, monthly reports, near real time viewing and service response. Modular by design, a plurality of individual input modules, which receive an analog voltage input, convert this signal to a digital format and send the digital signal to a central control which collects the data, then, at scheduled intervals, sends the collected data to a web server which contains the main software for the system. This software performs data comparisons, charts trends, predicts failures, plans and schedules service visits, then archives the data for future references. Alarm notifications are provided to the customer via Email, office phone (land line), cell phone (wireless), PDA, pager, etc. and can also be sent to a service provider to initiate the service response.

19 Claims, 2 Drawing Sheets

METHOD AND SYSTEM FOR MONITORING POWER SUPPLIES

BACKGROUND OF THE INVENTION

1. The Field of the Invention

The present invention pertains to a method and system to remotely monitor batteries and electrical power supplies to anticipate potential problems and effect a solution prior to any destructive power failure.

2. The Prior Art

Uninterruptible Power Supplies (UPS), Telecommunications and Instrumentation DC Power Systems utilize batteries, typically lead acid batteries of either sealed or flooded design, as a backup power supply. When batteries in this type of equipment fail, this can cause disruption in related operations. Without constant monitoring of the condition of the batteries, customers may expect to experience battery deterioration and eventually a battery failure at some point in time. A system failure can be extremely expensive in lost data, equipment, and emergency service response (down) time.

In every day operations there is an ongoing concern about the condition of batteries which form the back up power supply. Users of Uninterruptible Power Supplies currently face the choice of either replacing batteries at short specified intervals, waiting for a battery failure, which can have catastrophic consequences, or have periodic load tests performed by a field service engineer. Random early replacement of batteries is exactly that, random. It increases the cost of the system over a period of time while creating extra work and expense for the customer, including the hidden expense of environmentally approved battery disposal. Periodic load tests are only snapshots in time. They are expensive and disruptive.

Electrical power from public utility companies has been found to be a source of disruptions in the operations of many companies. With the increase in a public utility's overall load, the lack of new power generating plants coming on-line, and the deregulation of utility companies, these problems of interruptions will most likely continue to increase over the foreseeable future. UPS systems are installed to help compensate for power failures, but these can become an expensive sacrificial device in the circuit or they can introduce new problems into the electrical power distribution.

Many power related problems can also come from within a customer's facility, whether it is in a building owned by them or leased space. Proper and continuous monitoring of the incoming electrical power can identify power as a source of problems that can be disruptive to the company's operation. Since the business environment changes over time, any power survey provided at a single point in time will not necessarily provide adequate information to show that electrical power may be the source of computer problems, for example. Continuous power monitoring is the best way to set a benchmark and compare future power readings to determine if electrical power is the source of problems and if so, what and how to fix it.

Constant and continual monitoring of DC and AC power provides a means of identifying and correcting power and equipment problems when they arise and to take the proper action to correlate them. Predictive maintenance is less expensive, over a long term, than reactive emergency maintenance, especially when the absence of down time is factored in.

A monitoring system consisting of hardware and software alone is not adequate. Someone still has to monitor the data and make the determination if a service response is required. In order for a service response to be focused on a problem, rather than trying to identify a problem after it has occurred, a remote monitoring service providing the hardware, software and personnel to support the customer's site(s) remotely is clearly preferable.

SUMMARY OF THE INVENTION

The subject invention is a system for remotely monitoring batteries and electrical power supplies through a call center, providing continual monitoring, monthly reports, near real time viewing and service response. It consists of hardware and software that resides locally at a customer's site, an Internet connection, a web site for customer access, data analysis, and an emergency communication link to the customer and field service provider.

The subject invention is modular by design and has a plurality of individual Input Modules (IM), which receive an analog voltage input, convert this signal to a digital format and send the digital signal to a Central Control (CC). The Central Controller collects the data from each input module, then, at scheduled intervals, sends the collected data to a web server which contains the main software for the system. This software performs data comparisons, charts trends, predicts failures, plans and schedules service visits, then archives the data for future references. The software also provides near real time reports when a customer logs into the system to view up to date information. A regular monthly report is generated and sent via Email Alarm notifications are provided to the customer via Email, office phone (land line), cell phone (wireless), PDA, pager, etc. Alarm notification can also be sent to the service provider (if under service contract) to initiate the service response. These alarms are all customized by the customer for their specific needs. There are no limits to the number of alerts that can be set. These are determined during the sales and setup process. The customer is billed monthly for the service as determined by the number of sites; systems; batteries; reports; notified points during an alarm; etc.

BRIEF DESCRIPTION OF THE DRAWINGS

The present invention will now be described, by way of example, with reference to the accompanying drawings, in which.

DETAILED DESCRIPTION OF THE INVENTION

Figure 1:
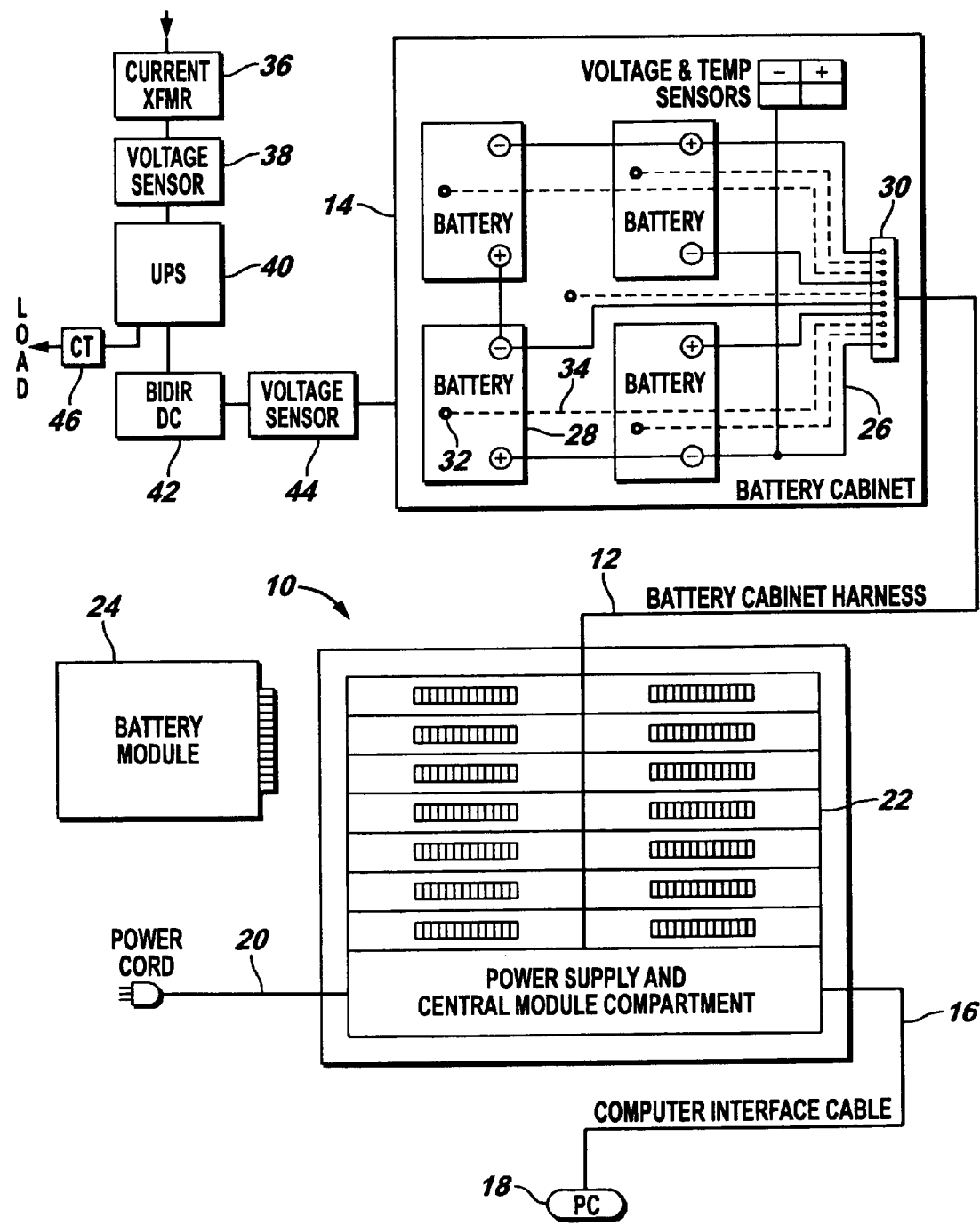
FIG. 1 is a schematic representation of an input module for a battery monitoring system in accordance with the present invention.

There is a great need to provide the customer with a full time measurement and trending of their UPS and DC plant batteries as well as incoming electrical power from a public utility. A Battery Monitoring System (BMS), such as that shown in the Figures, provides DC measurements in "near" real time providing up to the minute, continual measurements during the battery's three states, float, discharge, and recharge. Each of these measurements is needed to accurately determine the integrity of individual batteries in any type of battery system. Constant measurement provides the required measurement data to build a curve with enough resolution to "chart" the battery. As a "virtual technician" the BMS system provides this capability for each battery in a system and under all conditions. In addition to monitoring the DC voltage at each battery, the system looks at: the system's battery charger; individual battery temperature; ambient temperature; equipment load; and incoming electrical power (from a commercial source).

The subject inventive system does not measure the internal resistance of each battery, PH levels of battery acid or any other parameters. Rather it measures battery voltage and temperature, looking for changes in these measurements from a benchmark, set during installation, and actual measurements, as compared to factory standards. By comparing the derived battery curves to factory standards, the BMS software can determine if a battery is strong enough to provide power instantly when called upon or if it will become a potential problem at some point. The subject system can predict the future failure of a specific battery thereby allowing the customer, and/or their service support, to properly correct the problem, through selective battery replacement, before a power failure drops the equipment loads, causing a more expensive failure through lost data, process shutdowns and down time, and damage to equipment. The installation cost and monthly monitoring fees should be well below the cost of annual, semiannual or quarterly load tests. However, even quarterly battery load tests only provide a snapshot in time. One day out of a ninety-day period still leaves a vulnerable eighty-nine-day blocks of time during which a power failure might occur. The selective replacement of only those batteries which are at or beyond their effective life is an economical and feasible management tool with substantial long term cost benefits to the customer.

Continual electrical power monitoring tracks the incoming electrical power from commercial sources looking for disruptions and disturbances, whether they are momentary events or larger catastrophic events. This provides the customer with a record of all power events to assist in keeping their systems operating properly. Computer software and hardware are notoriously blamed as the culprits in system failures when, in reality, public utility studies have proven that commercial power is the source of disruption between 80 and 90% of the time. Since most disruptions occur rapidly, without leaving any record, Information Technologies (IT) managers start grasping for answers as to the source of the problems they encounter. A power monitoring system provides the information needed by an IT manager to determine if commercial power interruption was the source of the disruption and, if so, where it came from and what needs to be done to correct the situation. A computer or network problem can possibly be linked to a power event, if the power event was recorded. In some cases this information may support an insurance claim.

Continual localized AC and DC power monitoring is only part of the solution. Collected data will tell a story and assist in identifying problems and correcting them, but someone still needs to review the data and act on it. The subject remote monitoring service, as shown the accompanying drawings, fulfills this need. Remote monitoring transmits raw data to a central point where all data is collected, corrected, reviewed and analyzed by a computer system and a power specialist who reviews and acts on that data. Emergency service calls, planned service calls for minor issues and scheduled replacements can be accomplished through this remote sensing power monitoring system.

Most battery monitoring systems are sold as a piece of hardware to be installed and used by a customer, who generally is busy with their normal schedule and routine for conducting their business. They may lack technical knowledge in the realm of batteries or electrical power and their only concern may be that they have electrical power when they need it. Once the subject remote sensing power monitoring system is installed, the function of constantly monitoring a battery power supply becomes a boring task for a human operator watching over the system. The majority of the time the subject remote sensing power monitoring system is measuring a float voltage across each battery in its normal condition. Only during outages and recharge cycles is the monitored information of much value. Since these occurrences are not regular, nor can they be predicted, there is no logical way of watching for them except through a constant remote sensing power monitoring system according to the present invention.

The second issue for a business, after acquiring battery data, is what does the data mean? Is there really a problem? Will there be a failure now or later? What do I do now? The remote sensing battery monitoring system of the present invention provides the answers for these questions through a control center which receives all the data from the remote sensors.

The remote sensing means, or local system, is shown in FIG. 1. The Module Enclosure (Central Module) 10 has external battery cabinet harness 12 connected to battery cabinet 14, an interface cable 16 connected to PC 18, and power cord 20 for connection to a source of commercial power. The Module Enclosure 10 contains a plurality of individual battery and other input sensor modules 22, a multiplexor board (not shown) and a battery module key 24. The battery cabinet 14 has an internal wiring harness 26 attaching each battery 28 to a terminal strip 30 within the battery enclosure 14. A small wafer thermistor 32 is attached to the top center of each battery 28. The leads 34 from each thermistor 32 are brought to the terminal block 30. A DC Current Transformer (CT) 36 is attached, through voltage sensor 38, to the DC leads of the UPS or charger 40. Input voltage and current are measured with a current transformer 42 and voltage sensor 44. This CT 42 is a bidirectional device measuring DC charge current and discharge current. An AC Current Transformer (CT) 46 is attached to the UPS' output power. The AC CT 46 measures the equipment load on the UPS. A sensor is installed to monitor incoming power. This is an on/off device to signal that there is an outage. The local PC 18 preferably has a network interface or modem (neither of which is shown).

Figure 2:
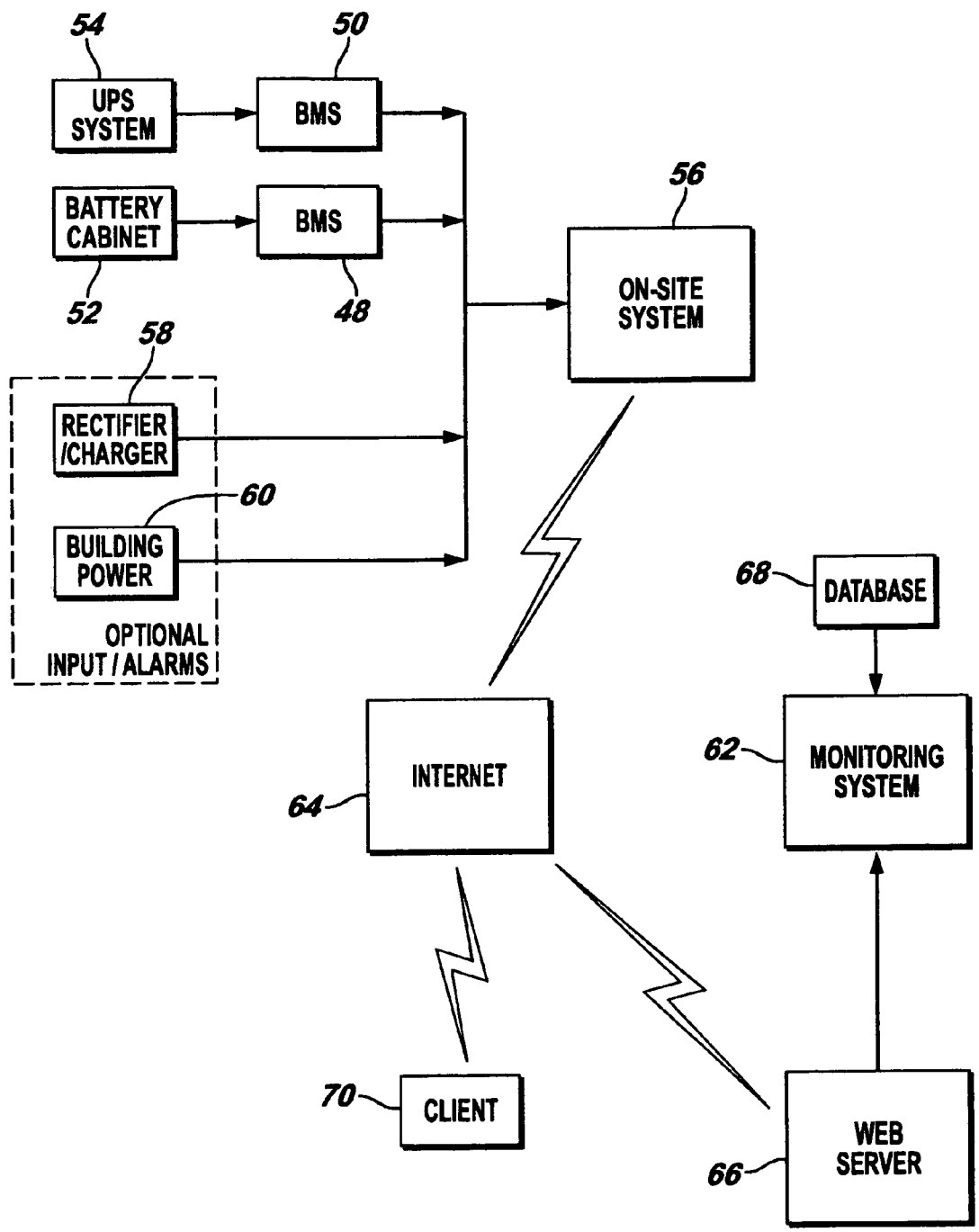
FIG. 2 is a schematic representation of the subject battery monitoring system.

The subject system is shown in FIG. 2 with battery monitoring systems 48, 50 collecting data from respective battery cabinet 52 and uninterruptable power system 54 and sending this data to the on site monitoring system 56. Optional alarms, such a rectifier/charger 58 and building power 60 alarms may be added to the system The modules 48, 50 collect analog data from the battery cabinet 52 and UPS system 54, respectively, and convert this data to a digital form and sends the digital information to the onsite system center 56. The sites contact the central center 62, via the Internet 64 and web server 66, and processes the incoming data for each site within a customer's account and comparison data from a data base 68. Client 70 contact can be via the Internet 64 Multiple systems at a single location or multiple sites can be continuously monitored and analyzed. All of this work is performed at the call center 62 keeping hardware investment for each site at a minimum The monitoring software resides at the web site providing the advantages of: immediate updates/upgrades; immediate response to software problems; reduced possibility of software theft; reduced size and complexity of local PC; reduced need for remote and multiple site support; reduced number of delinquent accounts; provides monthly contact with the customer through E-mailed reports and phone support, and assures that someone is acting on any problems which may arise.

The call center supports round-the-clock monitoring of the assigned sites. Catastrophic events will initiate an alarm, which automatically notifies the customer, through channels which the customer has setup in their account. E-mail is sent providing the parameters of the event in a written report. Pager, cell phone, PDA calls are made as requested by the client. At the same time a service call is initiated through the field service group assigned to that account. They will initiate a service response armed with a report with the details of the event. Knowing what the problem is before the service personnel arrive on site provides for a faster repair time than for a typical service call. In cases where the problem can be resolved through the connection to the site, the service group will work with the call center to make a correction and report to the customer any details or subsequent action taken or needed. The subject remote sensing battery power monitoring system provides a monitoring service for battery and electrical systems with a complete service from identifying the problem to solving it.

During normal operation of a UPS or DC system test, there is no way to measure each battery at the same time except with an attachment to each battery. Each battery needs to be measured at the same point in time during its test as well during each of its three states, float, discharge, and recharge. This data is needed to properly chart and compare the battery's value to factory standards and the initial benchmark.

The web site will receive information from each of the individual remote sensing sites. This information includes: the customer number, site location, uninterruptible power supply number, string number, and battery number, or sensor number. The data is sent to the customer file for storage and data manipulation. Most of the data will be "float" values which will be repetitive. This data can be crunched or averaged into smaller blocks. The primary data of interest will be during power outages that will vary from site to site and from time to time. Speeding up the polling rate, during an outage and recharge period, will expand this "outage" data. This is a true load test. The discharge and recharge curves will have more resolution. This data stream is the true value.

These curves are valuable when comparing them to each other, over time, and in comparison to benchmark readings and factory standards. A reference library of factory standards will be built for each battery in current or recent production. The factories provide detailed specification sheets, with temperature compensation multipliers, for each model battery. This data will be converted to numerical values for comparison. The data will be stored by brand and model.

The subject remote monitoring battery monitoring system collects voltage and temperature data for each battery in the system. Discharge current and recharge current (amperage) values are also collected for each battery. Variations in these values are valuable in that any changes should indicate a potential problem in the system's charger or a change in outside influences, such as the load or ambient temperature.

The output load (amperage) is monitored. As the output load changes, it will positively or negatively affect the discharge curve. If the customer hasn't added any load, but sees an apparent increase in load, it may indicate that someone has inadvertently added equipment to the uninterruptible power supply output distribution. The customer needs to know this information immediately so that corrective steps can be taken.

All input data; battery voltage and temperature, AC output current, ambient temperature, and discharge/charge current will be used to look for changes. The changes in discharge curves may or may not be normal. The system looks for changes and predicts when a change will exceed the limits of any battery, indicating a potential failure. Catastrophic failures cannot be predicted, but they can be charted to see what events took place immediately preceding the failure and what they may have looked like.

Gradual change will occur, over time, and is expected. That change will be watched and battery replacement dates can be anticipated. UPS/charger failure can also be predicted or caught before it reaches a catastrophic level. Ambient temperature changes can be indicators of other problems such as facility A/C failure or UPS fan failure. Room/ambient temperature can be monitored separately if not already being done. The subject system can accept any analog or digital input on a separate channel(s). It is only necessary to know what is being monitored and what the data is being compared to include it in the monitor function.

The web site will preferably have: a front end for data entering the system; customer file storage for incoming raw data; refined data from creation of curves; customer reports; reported data facts on battery brand performance; service history from an initial setup through the history of the system; customer activity in visiting the site and report requests; server/processor for data manipulation; battery (and any other item monitored) data library for comparison; report processor and generator; communication processor for outgoing reports; communication access for customers visiting site for custom reports or near real time system viewing; demo system for potential customers to visit and view sample reports and activity (possible web cam capability at demo site or customer); and a processor for collection of specific battery brand performance and reporting to manufacturers.

Firmware in each battery input module collects measurements (data) in analog format and convert this data to digital format (A/D). Firmware on the multiplexor board: polls each module/sensor at a preselected time interval (the polling rate is externally controlled either locally or remotely); collects data from each sensor; summarizes data into packets; provides time/date/location stamp (optionally residing in a local PC); and increases polling rates during outage and recharge modes.

Software in a local PC: provides time/date/location stamp (optionally residing on multiplexor board); stores data until required to transmit to web site; provides a communication link to Internet through either dial-up or LAN interface; records data collection and transmission history and stores data as an archived file for a short time.

The central web site provides: acknowledgment of incoming site data to customer files; collects data on preassigned intervals; converts data to charts/curves for comparison to factory standardized curves; analyzes data for any anomalies that may indicate a failure trend and predicts a point of potential failure; compiles monthly reports for monthly Email to customers; keeps site report current for customers who log into the system for real time viewing of data; triggers an alarm when data is outside set parameters; provides alarm via Email, call to pager, cell phone, PDA, etc.; averages data over short term periods; compresses data over long periods of time; archives data at some point for analysis purposes of specific battery data; initiates advance notice of potential problems to the service group to assist in scheduling service; initiates emergency service call to the service group under failure or catastrophic events The call center interfaces customer support staff to the subject system; allows account managers to view their customer's data and support them; provides routine call schedules for follow-up and advance notice of scheduled site visits. The existing battery monitoring systems only provide the hardware, embedded software, and local software for installation in local PC. The burden of actually monitoring the batteries falls on the customer of such system.

Instead of a front-end high system cost, the subject remote sensing power monitoring system is designed to relate to the customer's battery maintenance visits, which are either not being performed or are irregular at best. For a small monthly fee, typically near the cost of an annual battery preventive service visit, the customer receives continuous battery and/or power monitoring in addition to the data analysis, monthly written report, available real time display via the Internet, and associated service response (if included the package), This "virtual technician" replaces the customer's internal process of battery testing or hiring some outside contractor at a higher rate to perform the same work. The cost of an annual electrical power study is also off set by the smaller monthly cost of our service. Most customers are not performing either battery or power monitoring on a regular basis. When a problem arises, the customer is left without any information on this to what may have caused the problem Mean time to repair is lengthened by not knowing where to start.

The sensors used are: DC Battery lead attachments; AC Input Voltage (Power Transformer); Temperature Thermistor (Millivolt input); and Current Transformer (AC & Hall effect DC). Any other input sensor can be added for external or internal measurement.

Briefly, the subject remote sensing battery power monitoring system has voltage (input voltage) sensing, and temperature (individual battery and ambient). The different voltage ranges and type of voltage (AC or DC) will be flashed (programmed) based on system and customized requirements at time of system configuration and set-up. The input module is mounted in a central enclosure with all of the input modules for that system. The size of the housing is dependent upon the number of input modules required. There will, preferably, be room to store spare input modules without their being attached to the system Each module will have a model and serial number displayed on a label as well as embedded in its firmware. This information is logged in the main software upon system start-up and initial configuration Should a module fail in the field, its failure and information will be logged in the main software's failure report and will be changed in the configuration file when changed out. Failure data can be used to track problems and improve quality control.

The Central Controller (CC) is the main unit at the customer's site. It resides in the input module enclosure with the input modules. All collected data is sent to this component where it is stored and summarized. System data, measurements, date/time stamps, and module information are embedded into the data. The central controller will have a microprocessor to control the process. The service engineer can adjust, change or control it during site visits or by the system administrator at the web site. This requires a two-way communication link. Each battery is attached to an input module enclosure by way of a wiring harness. This harness has one end attached to each battery and to the input module enclosure on the other end by way of a large, single connector. The number of wires in a wiring harness consists of one more wire than the number of batteries.

The input module enclosure (IME) serves a dual role. It houses the plurality of input modules and the central controller. It is connected to an on-site PC. The concept of this enclosure is similar to a parking garage using slots with a back plane connector. The enclosure will be sized for extra "dead" slots to hold spare modules. Multiple enclosures can be used for larger applications. The enclosure will reside near the battery string to keep wiring to minimum lengths.

The local software/firmware is embedded in the input module and central controller. It is designed to have the primary functions programmed at the factory. An input module is attached to each sensor. The input module is set for the voltage type and range in which it will be collecting data. Site-specific information will be flashed during installation/setup by way of a laptop. This function could be performed during the initialization process with the web server. Individual serial numbers are recorded along with site information; UPS or battery model and serial number. Start date and technician or installer information is also recorded along with any other pertinent information. A benchmark reading of the battery's float level and possible discharge rate will be made. It is suggested that the installation coincide with the installation of a new set of batteries or during a battery load test.

The main software resides at the web site for several reasons: security from theft; reduced chance of hackers entering the customer's network; one upgrade affects all customers; reduced customer support; reduced computer system requirements at the site; and provides a lower cost of installation and hardware for customers who have a local PC and Internet connection.

The following steps are required to add a new battery: In a file or directory, there will be a table identifying the battery by manufacturer, series, and model. There will be several graphs, depending on the manufacturer, but the graphs are pretty much the same. The graphs will be the discharge curves, charge curves, etc. All of these are based on the standard set by the factory such as full load, half load ratings. A standard will be selected to use for all manufacturers, then take these graphs and digitize them into numeric values (points on the graph). Temperature, loading and any other variants will also have an effect on the graph's value, so these things will be measured in addition to the battery voltage and current. Once these values have been obtained, they will be put into a table where calculated values will be made taking the variants into consideration. The variants affect the data, but will be calculated to compare the collected data to the factory standard. In other words, placing it on the same scale. There will be a continuous computer analysis being performed on our server as data is collected, analyzed and stored for all customers' equipment.

Once this equalization has been done, the system will then compare the differential or variance from the norm. An acceptable window will be around the factory standard based on factory recommendations. The window is for alarm purposes. The computer calculations will predict when the collected data's curve will exceed that window and may change as the battery values change, but we can begin to see the expected time frame when a failure is expected long before it happens. In the case of a rapidly deteriorating battery or a fast failure, it may an alarm rather than a prediction that gets our attention, but that should be rare.

The following steps are required to add a new customer: There will be a customer database with an information needed to support that customer. Billing information is preferably not available here, only customer names, contacts, titles, phone, fax, pager, cell, PDA, site name, location (for our service people), UPS brand, serial number, system ID (if multiple UPS' at one site), date of system installation, date of last battery install, brand and model batteries, battery date and manufacturer codes, battery quantity, string/parallel configuration, possible sketch or drawing of battery layout and interconnections, possibly the floor layout, directions to site, other systems on site (for reference only), and any other information needed to support this customer and this site. Any new customer would have this data entered into a new file created by our system administrator. This would be a database, possibly SQL Server (our programmers choice) or Oracle. This setup is something that can only be done by our administrator, but it is not much more than adding a new name and info into any other database.

The following steps are taken to monitor a customer's system; Once the customer has signed on, the customer file is established and set up. Then the remote sensing battery monitoring system of the present invention is installed at the customer's site (existing system), or installed before shipment of a new battery or UPS system to a site. In the case of an OEM such as Toshiba or battery cabinet manufacturer/assembler, they would have the internal batteries pre-wired to a connection point on the rear of the UPS or external battery cabinet. The subject system would attach to this connection point in the field during system start-up or a delayed installation (purchased later). The customer's network administrator would complete the data connection to our system by setting up the present remote sensing battery monitoring system's IP address(es) in his server. The outbound and inbound communication and associated security would be setup by the customer's administrator in conjunction with our system administrator. Once the two systems are talking and data is flowing, the customer (user, not administrator is given the login authorization and procedures for accessing the data and creating his own reports). Then it will be possible to provide reports monthly in any format, with the customer customizing his reports and frequency of submittals. If equipment other than batteries and the UPS' are monitored, there will be an extra charge, but that is all set up on the front end based on what they purchase. The reports and access to the data is open to the customer. There may be multiple login names and users as well as multiple report submissions to the customer based on their contract and monthly fee. The reports will be reviewed to plan on using a means of having monthly/quarterly/semiannual discussion with the customer to stay in touch for service and marketing plans. There will be a lot of data collected and daily manipulation of that data. The server will be constantly analyzing and storing data. As data becomes old, a time frame will be set in which the data becomes averaged. As this averaged data becomes older, this term can be lengthened. At some point, the data can be placed into a file and archived to a CD. Other considerations will be made as access to the server increases and the amount of data increases. This site can/will become a large ISP.

The present invention may be subject to many modifications and changes without departing from the spirit or essential characteristics of the present invention. Therefore the foregoing description should be considered in all respects as illustrative and not restrictive of the scope of the invention as defined by the appended claims.

I claim:

1. A system for remotely monitoring electrical power supplies, comprising:

a plurality of individual input modules each connected to a respective power source and having means to receive an analog voltage input and to convert said analog signal to a digital form, each said input module is used for DC battery voltage and DC charger/bus voltage, DC amperage at the DC bus, AC input voltage sensing, and both individual battery temperature and ambient temperature sensing, the different voltage ranges and type of voltage are programmed on system requirements;

central controller means connected to collect data from each input module and, at scheduled intervals, send that data to web server means containing primary system software capable of performing data comparisons, charting trends, predicting failures, planning and scheduling service visits, and archiving data for future reference, said software also providing near real time reports, regular monthly reports, and alarm notifications which can be sent via E-mail, telephone land lines, cell phone, PDA, or pager.

2. The system for remotely monitoring electrical power supplies according to claim 1, wherein each said input module comprises:

DC battery lead attachment means;

AC input voltage power transformer means;

temperature thermistor means attached to each battery being monitored; and current transformer means.

3. The system for remotely monitoring electrical power supplies according to claim 1, further comprising:

wiring harness means in each said input module means, each said battery being monitored is attached to one end of said wiring harness means the other end of which is attached to connector means of said input module, the number of wires in said wiring harness means being one more wire than the number of batteries being monitored.

4. The system for remotely monitoring power supplies according to claim 3, further comprising:

additional sensor means attached to said input modules through said harnesses.

5. The system for remotely monitoring electrical power supplies according to claim 1, wherein said central controller comprises, microprocessor means to collect data from said input modules, store and summarize said data, said data including: system data, power measurements, date/time stamps, and module information embedded in the data; and a two-way communication link.

6. The system for remotely monitoring electrical power supplies according to claim 1, wherein said software is embedded in each said input module means and said central controller means;

one of said input module means attached to each sensor and set for the voltage type and range in which it will be collecting data.

7. The system for remotely monitoring electrical power supplies according to claim 6, wherein said data includes site-specific information, individual input module serial numbers, uninterruptible power supply or battery system model and serial number, start date, technician/installer information, and a benchmark reading of each the battery's float level and possible discharge rate.

8. The system for remotely monitoring electrical power supplies according to claim 1, wherein said software resides at a web site thereby providing: security from theft; reduced chance of hackers entering the network; one upgrade affects all sites; reduced customer support; reduced computer system requirements at the site; and a lower cost of installation and hardware for customers who have local PC and Internet connection.

9. The system for remotely monitoring electrical power supplies according to claim 1, wherein said power supply is AC.

10. The system for remotely monitoring electrical power supplies according to claim 1, wherein said power supply is DC.

11. A system for remotely monitoring electrical power, which includes both electrical power from commercial electrical power utilities and battery operated electrical power backups, comprising
- a plurality of individual input module means each connected to a respective electrical power source and each receiving an analog voltage input indicative of the status of said electrical power supply and converting said analog signal to a digital signal;
- central controller means connected to collect said digital data from each input module means;
- web server means containing primary system software capable of performing data comparisons, chart trends, predict failures, plan and schedule service visits, and archive data for future reference, and at scheduled intervals said web server means receiving said digital data from said central controller, said software embedded in the input module and central controller;
- an input module attached to each sensor and set for the voltage type and range in which it will be collecting data;
- said data including site-specific information, individual input module serial numbers, site information, uninterruptible power supply or battery system model and serial number, start date, technician/installer information, a benchmark reading of the battery's float level and possible discharge rate.

12. The system for remotely monitoring electrical power according to claim 11, wherein each said input module means comprises:
- DC battery lead attachment means;
- AC input voltage power transformer means;
- temperature thermistor means attached to each said DC battery; and
- current transformer means.

13. The system for remotely monitoring electrical power according to claim 11, further comprising:
wiring harness means in each said input module means, each said wiring harness having one end attached to each battery and attached to an input module bus on the other end, the number of wires in a wiring harness consisting of one more wire than the number of batteries connected by said wiring harness.

14. The system for remotely monitoring electrical power according to claim 13, further comprising:
additional sensor means attached to said input modules through said wiring harness mean.

15. The system for remotely monitoring electrical power supplies according to claim 11, wherein each said:
input module means measures DC battery voltage, DC charger/bus voltage, DC amperage at the DC bus, and both individual battery temperature and ambient temperatures, the different voltage ranges being programmed in said central controller software.

16. The system for remotely monitoring electrical power supplies according to claim 11, wherein each said:
input module means senses AC input voltage and ambient temperature, the voltage ranges programmed in said central controller software.

17. The system for remotely monitoring electrical power supplies according to claim 11, wherein central controller comprises,
microprocessor means to collect digital data from said input modules, store and summarize said digital data, which includes: system data, power and battery measurements, date/time stamps, and input module information; and
two-way communication means with customers.

18. The system for remotely monitoring electrical power supplies according to claim 11, wherein said software resides at the web site thereby providing: security from theft; reduced chance of hackers entering the network; one upgrade affects all sites; reduced customer support; reduced computer system requirements at the site; and a lower cost of installation and hardware for customers who have local PC and Internet connection.

19. The system for remotely monitoring electrical power supplies according to claim 11, wherein said software of said web server also provides near real time reports, regular monthly reports, and alarm notifications which can be sent via E-mail, telephone land lines, cell phone, PDA, or pager.

* * * * *